United States Patent
Choi et al.

(10) Patent No.: US 8,830,110 B1
(45) Date of Patent: Sep. 9, 2014

(54) WINDOW-ENABLED TIME-TO-DIGITAL CONVERTER AND METHOD OF DETECTING PHASE OF A REFERENCE SIGNAL

(71) Applicant: Nvidia Corporation, Santa Clara, CA (US)

(72) Inventors: Dong-Myung Choi, Santa Clara, CA (US); Madhusudhan Sarda, Karnataka (IN); Anu Subbaraman, Santa Clara, CA (US); Kwanjee Ng, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 46 days.

(21) Appl. No.: 13/792,558

(22) Filed: Mar. 11, 2013

(51) Int. Cl.
H03M 1/50 (2006.01)
H03M 1/64 (2006.01)
G04F 10/00 (2006.01)
H03M 1/60 (2006.01)

(52) U.S. Cl.
CPC .............. *H03M 1/64* (2013.01); *G04F 10/005* (2013.01); *H03M 1/60* (2013.01); *H03M 1/50* (2013.01)
USPC .......................................... 341/166; 341/155

(58) Field of Classification Search
CPC .......... H03M 1/50; H03M 1/60; G04F 10/005
USPC .................................................. 341/155, 166
See application file for complete search history.

(56) References Cited

U.S. PATENT DOCUMENTS

| | | | |
|---|---|---|---|
| 6,754,613 B2 | 6/2004 | Tabatabaei et al. | |
| 7,332,973 B2 * | 2/2008 | Lee et al. | 331/25 |
| 8,064,561 B2 * | 11/2011 | Henzler | 375/371 |
| 8,090,068 B2 | 1/2012 | Sun et al. | |
| 8,299,826 B2 | 10/2012 | Perrott | |
| 8,330,630 B2 * | 12/2012 | Marie | 341/111 |
| 2009/0175399 A1 | 7/2009 | Sun et al. | |

OTHER PUBLICATIONS

Henzler, Stephan. "Time-to-Digital Converter Basics." Time-to-Digital Converters. Springer Netherlands, 2010; Chapter 2.
Perrott, Michael H. "Tutorial on Digital Phase-Locked Loops." Custom Integrated Circuits Conference. 2009.
Tokairin, Takashi, et al. "A 2.1-to-2.8-GHz low-phase-noise all-digital frequency synthesizer with a time-windowed time-to-digital converter." Solid-State Circuits, IEEE Journal of 45.12 (2010): 2582-2590.

* cited by examiner

*Primary Examiner* — Khai M Nguyen

(57) ABSTRACT

A window-enabled TDC and method of detecting phase of a reference signal. One embodiment of the window-enabled TDC includes: (1) a window generator configured to receive a reference signal and a clock signal, and (2) a TDC circuit coupled to the window generator and configured to be enabled based on the reference signal and disabled based on the clock signal.

20 Claims, 4 Drawing Sheets

WINDOW-ENABLED TIME-TO-DIGITAL CONVERTER AND METHOD OF DETECTING PHASE OF A REFERENCE SIGNAL

TECHNICAL FIELD

This application is directed, in general, to time-to-digital converters (TDCs) and, more specifically, to a window-enabled TDC employed to detect the phase error between two signals.

BACKGROUND

Phase detection circuits are increasingly being implemented in digital form, as is the trend for circuits in general. Digital implementations offer numerous benefits over analog alternatives, not the least of which are lower power consumption and reduced noise susceptibility. Both power and noise are primary considerations when selecting an all-digital phase-locked loop (ADPLL) implementation over an at least partially analog implementation. Low power and low noise demands are often found in communication systems, as are phase-locked loops (PLLs).

An all-digital implementation does not, however, relieve all constraints on PLL design. Many ADPLLs rely on a TDC to perform phase detection. TDCs produce a digital output, which is highly advantageous for processing digital signals. Unfortunately, they also produce significant noise. More specifically, the quantization a TDC necessarily performs introduces noise inversely proportional to the TDC's time resolution, which, in turn, is derived from gate-level delay times. A variety of improvements to the TDC resolution have been made, including the addition of Vernier delay chains and the evolution of two-stage TDCs. These improvements often yield resolution at the expense of space (footprint) and power, by adding power-consuming components and negating at least some of the benefit of being digital.

Further efforts have been made to reduce the "window" in which the TDC operates, otherwise known as the "measurement window." Conventionally, the TDC operates for the duration of a pulse of a reference signal. In a PLL, the reference signal is the source on which the PLL is attempting to lock. As a reference pulse propagates through the TDC, components are active and power is consumed. Higher resolution TDCs often add to the number of components. Efforts have focused on reducing the measurement window from the conventional reference pulse width without introducing noise and degrading resolution. One approach is to trim down the window size over time. The initial window may be the conventional reference pulse width, which is then reduced over time as long as precision is maintained. If precision falls off, the window can be enlarged to reacquire the reference phase.

Other developments have yielded designs effectively dictating a time window in which the TDC operates. One such approach is to trim the reference pulse by a programmable time delay. This approach provides an avenue to tune the time delay statically, through component selection, or dynamically. The trimmed reference pulse propagates through the TDC for as long as the programmable delay allows, depending on the desired noise and resolution performance. Alternatively, the inherent delay within the TDC itself can be used to define the window. Certain TDC designs include a delay chain of some sort as an element of the quantization process. In those TDCs, the window can be defined as the time it takes the reference pulse to propagate through the delay chain. These developments were ultimately valuable pursuits, yielding TDC designs that can maintain precision with a reduced measurement window. The reduced measurement window limits the power consumption of the TDC and the overall power consumption of the host integrated circuit, such as an ADPLL.

SUMMARY

One aspect provides a window-enabled TDC, including: (1) a window generator configured to receive a reference signal and a clock signal and (2) a TDC circuit coupled to the window generator and configured to be enabled based on the reference signal and disabled based on the clock signal.

Another aspect provides a method of detecting phase relative to an output signal, including: (1) enabling a TDC circuit upon a transition of a reference signal and (2) disabling the TDC circuit upon a transition of the output signal thereby generating an output related to a phase difference between the reference signal and the output signal.

Yet another aspect provides a PLL, including: (1) an oscillator configured to generate a clock signal based on an oscillator control signal having a phase error component, (2) a window generator configured to generate discrete signal edges based on the clock signal and a reference signal and (3) a TDC circuit operable to at least partially determine the phase error component based on the discrete signal edges.

BRIEF DESCRIPTION

Reference is now made to the following descriptions taken in conjunction with the accompanying drawings, in which.

DETAILED DESCRIPTION

Figure 1:
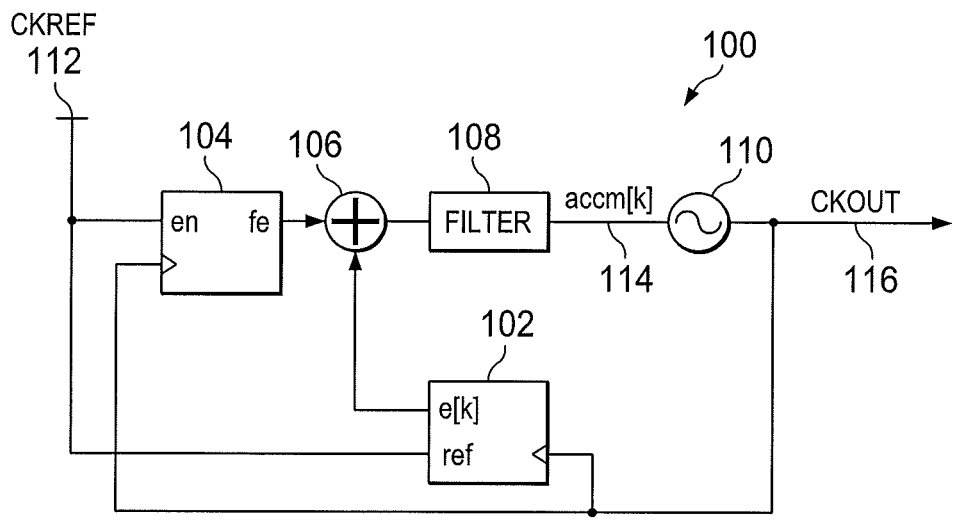
FIG. 1 is a functional diagram of a digital phase-locked loop circuit within which a window-enabled TDC or method of detecting phase may be embodied or carried out.

Certain TDC circuits include a set of D flip flops wired to a delay chain and in parallel to the local clock signal. Conventionally, the reference signal propagates through the delay chain and its state is captured on a local clock edge by the set of D flip flops. Each D flip flop captures a successively greater delayed reference signal. The reference signal is sometimes referred to as a start signal, and the local clock signal is accordingly referred to as a stop signal.

At some point in the delay chain, the reference signal transitions. The bit output from each D flip flop is then concatenated into a phase error word indicative of the phase difference between the reference signal and the local clock. In certain implementations, the reference signal and local clock signal are swapped, such that the reference signal triggers the latching of the D flip flops, thereby sampling the local clock signal. As mentioned above, there are a variety of available enhancements to the TDC circuit with regards to resolution, but this is the basic idea of time-to-digital quantization. In a PLL circuit, the phase error word is typically processed and used to control an oscillator that generates the local clock signal.

Efforts have been largely successful in reducing the TDC operating window, or measurement window, to limit power consumption. However, it is realized herein that the conventional approaches to reduction focus unnecessarily on the reference signal and the temporal aspects of its propagation through the TDC circuit. It is further realized herein that the basic quantization performed by the TDC demands only a single edge from the reference signal and a single edge from the local clock signal. A phase difference between two signals is ascertainable with this minimum data set. A measurement window containing more than the minimum data set is simply wasting power by continuing to drive the TDC.

It is realized herein that a measurement window derived from both the reference signal and the local clock can overcome the lingering drawbacks of the TDC improvements mentioned above while driving the TDC circuit for a fraction of the time as conventional alternatives. The first element of the minimum data set for quantization is an edge, or transition, of the reference signal. It is realized herein that this edge should constitute the beginning of the measurement window. The second element of the minimum data set for quantization is a local clock edge that triggers the capture, or latching, of the set of D flip flops. It is realized herein that the local clock edge should constitute the end of the measurement window. It is further realized herein that the quantization can be distilled down to a measurement window no wider than a single local clock pulse.

It is realized herein that the TDC can be implemented as a phase detector for a PLL by including a second stage TDC circuit. A first measurement window is created for the first, or "upper," TDC stage, and a second window initiates after the first has ended for the second, or "lower," TDC stage. The second TDC stage provides a reference period with which the phase difference produced in the first TDC stage is converted into a phase error. It is further realized herein that neither of the first and second measurement windows need exceed the duration of the single local clock pulse.

It is also realized herein that it is unnecessary to propagate the reference signal itself, or the local clock signal through the TDC. It is realized herein that digital signals synthesized from the reference signal and local clock edges are sufficient to drive the TDC circuit and are often more reliable than propagating the signals themselves. The synthetic digital signals define the measurement window and, in some embodiments, effectively isolate the TDC circuit electrically from the reference signal and local clock signal, including any associated noise.

Before describing various embodiments of the window-enabled TDC and method of detecting phase introduced herein, a PLL circuit within which the window-enabled TDC or method of detecting phase may be embodied or carried out will be described.

FIG. 1 is a functional diagram of a PLL circuit within which a window-enabled TDC or method of detecting phase of a reference signal may be embodied or carried out. PLL circuit 100 is a simplified PLL and contains a phase detection module 102, a frequency acquisition module 104, a digital filter 108 and an oscillator 110. Oscillator 110 generates a CKOUT signal 116 that is an output of PLL circuit 100 and functions as a local clock for phase detection module 102 and frequency acquisition module 104. A CKREF signal 112 is an input to PLL circuit 100 and serves as a reference signal for which PLL circuit 100 operates. CKREF signal 112 drives phase detection module 102 and frequency acquisition module 104. Phase detection module 102 provides a phase error signal as an output that is combined by a summer 106 with a frequency error signal provided as an output by frequency acquisition module 104. The combined error signals are processed by digital filter 108 yielding an oscillator control signal, accm[k] signal 114. The control signal, accm[k] signal 114, drives oscillator 110, which generates and modifies CKOUT signal 116 accordingly. Ultimately, the goal of PLL circuit 100 is to produce a local clock signal, CKOUT signal 116, that matches the reference signal, CKREF signal 112, with respect to frequency and phase.

Having described a PLL circuit within which the window-enabled TDC or method of detecting phase may be embodied or carried out, various embodiments of the window-enabled TDC and method of detecting phase will be described.

Figure 2:
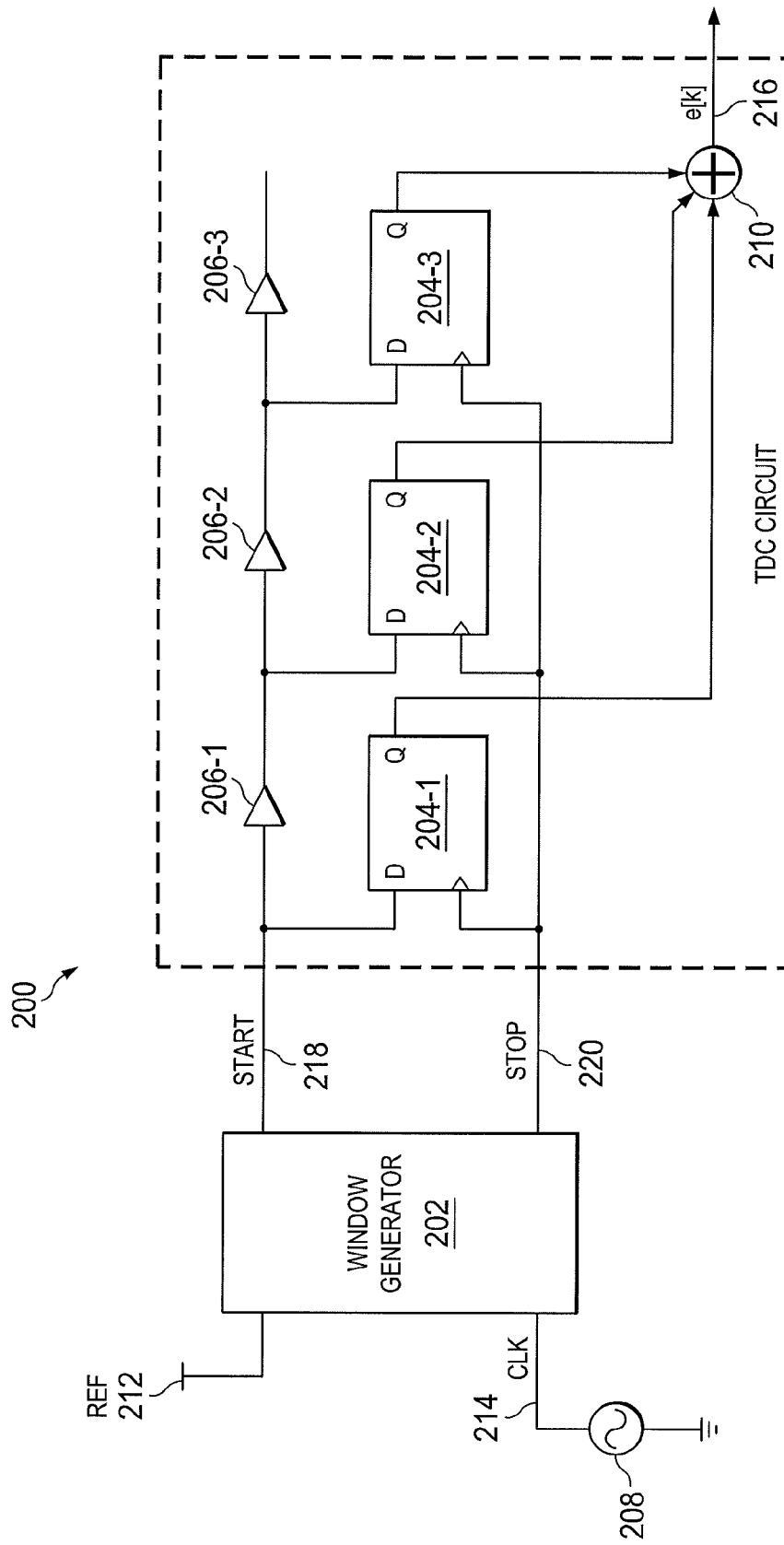
FIG. 2 is a functional diagram of one embodiment of a window-enabled TDC.

FIG. 2 is a functional diagram of one embodiment of a window-enabled TDC 200. Window-enabled TDC 200 may be employed as a phase detection module, such as phase detection module 102 of FIG. 1, in a PLL circuit. In this embodiment, window-enabled TDC 200 includes a window generator 202, D flip-flops 204-1, 204-2 and 204-3, delay elements 206-1, 206-2 and 206-3, oscillator 208 and summer 210. A TDC circuit conventionally would include D flip-flops 204-1, 204-2 and 204-3, delay elements 206-1, 206-2 and 206-3 and summer 210. Alternate embodiments of window-enabled TDC 200 may include a longer chain of flip-flops and delay elements depending on the desired configuration and precision. Certain embodiments omit oscillator 208 in favor of relying on an externally generated clock signal. This is often the case in PLL circuits that include an oscillator in their architecture. Window-enabled TDC 200 may be implemented with or without oscillator 208.

D flip-flops 204-1, 204-2 and 204-3 are coupled in parallel with respect summer 210. Delay elements 206-1, 206-2 and 206-3 are arranged in a chain, otherwise known as a delay chain. Window generator 202 is configured to receive a reference signal, REF 212, and a clock signal, CLK 214, as inputs, CLK 214 being generated by oscillator 208 or, alternatively by an external source. Window generator 202 provides a start signal 218 and a stop signal 220 to drive the delay chain (delay elements 206-1, 206-2 and 206-3) and the D-flip flops 204-1, 204-2 and 204-3.

REF 212 is an input signal for window-enabled TDC 200 and is essentially the object of the quantization performed. CLK 214 is a local clock signal that serves as the measurement tool for time quantization. REF 212 and CLK 214 are employed by window generator 202 to synthesize start signal 218 and stop signal 220. The first edges of start signal 218 and stop signal 220 define the window in which the TDC circuit operates, or the measurement window. The first edge of start signal 218 correlates to an edge of the reference signal, REF 212. The first edge of stop signal 220 correlates to an edge of the clock signal, CLK 214. In certain embodiments, the TDC circuit is isolated from the reference signal, REF 212, and the local clock signal, CLK 214, by window generator 202. The synthesized discrete pulses, in many cases, provide a more reliable driver for the TDC circuit.

As the edge of start signal 218 propagates through the delay chain, temporal samples of start signal 218 are triggered by the edge of stop signal 220 and captured by D flip-flops 204-1, 204-2 and 204-3. D flip-flop 204-1 captures the least delayed aspect of start signal 218; D flip-flop 204-2 captures the next least, start signal 218 being delayed only by delay element 206-1; and D flip-flop 204-3 captures the most delayed, start signal 218 being successively delayed by delay elements 206-1 and 206-2. Alternate embodiments employing more than three D flip-flops would capture aspects of start signal 218 delayed by delay elements 206-1, 206-2, 206-3 and any further delay elements included beyond those.

The output of D flip-flops 204-1, 204-2 and 204-3 are combined into an error word, e[k] 216, by summer 210. The error word is the output of window-enabled TDC 200 and represents a time quantization, phase difference, of the reference signal relative to the clock signal, or REF 212 relative to CLK 214.

Figure 3:
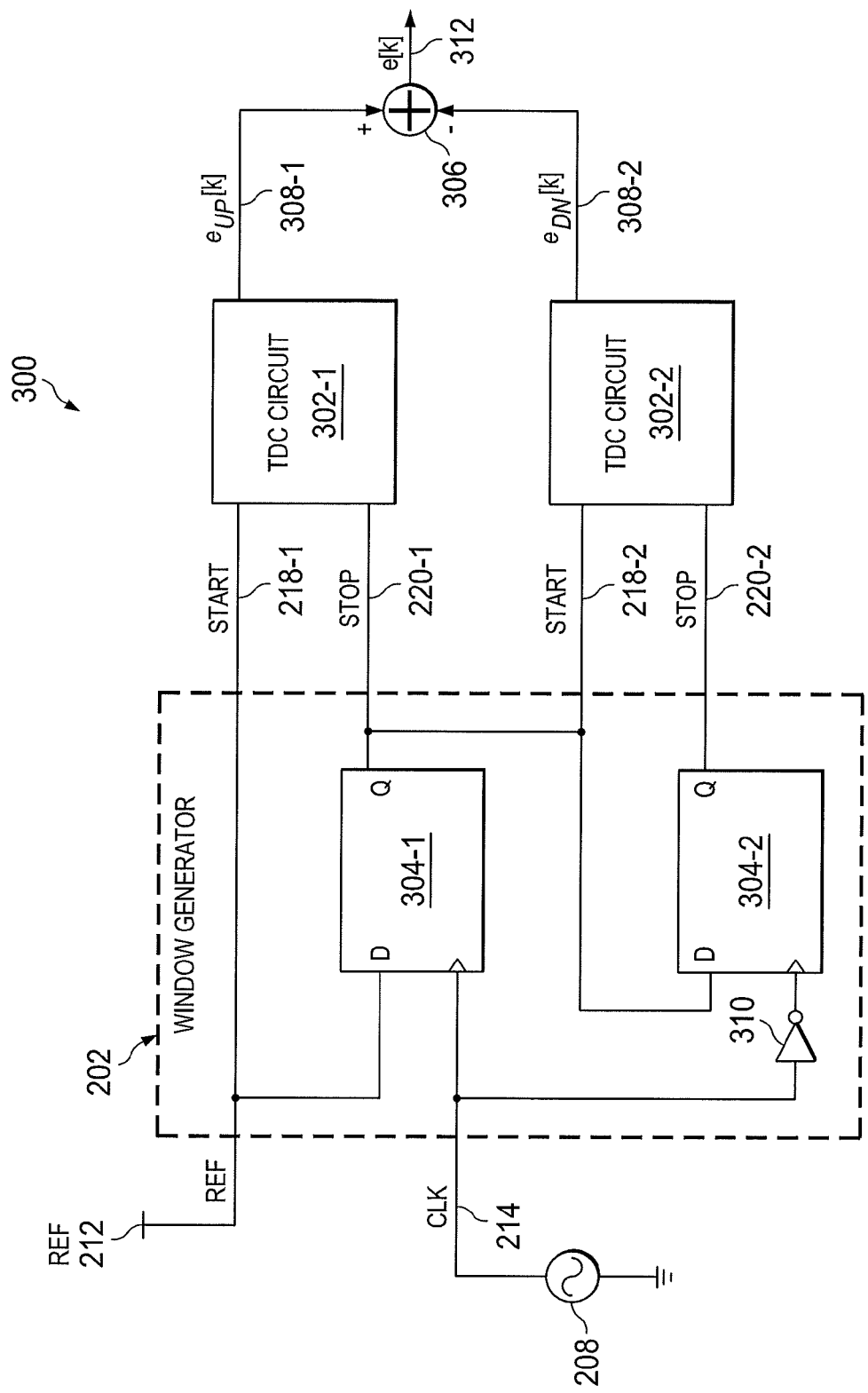
FIG. 3 is a functional diagram of one embodiment of a window generator of FIG. 2 coupled to an upper and lower TDC circuit.

FIG. 3 is a functional diagram of another embodiment of the window-enabled TDC, window-enabled TDC 300. Window-enabled TDC 300 includes window generator 202 of FIG. 2 coupled to REF 212 and CLK 214, also of FIG. 2. Window-enabled TDC 300 includes two TDC circuits, TDC circuit 302-1 and TDC circuit 302-2. TDC circuit 302-1 provides a phase difference output, $e_{UP}[k]$ 308-1, and TDC circuit 302-2 provides a reference output, $e_{DN}[k]$ 308-2. When combined by a summer 306, $e_{UP}[k]$ 308-1 and $e_{DN}[k]$ 308-2 produce a phase error output, e[k] 312. This embodiment is most applicable in PLL implementations.

Window generator 202 drives TDC circuit 302-1 and TDC circuit 302-2 based on REF 212 and CLK 214. Window generator 202 includes a first D flip-flop 304-1 and a second D flip-flop 304-2, and an inverter 310. Window generator 202 drives TDC circuit 302-1 with a start signal 218-1 and a stop signal 220-1 such that start signal 218-1 correlates to an edge of REF 212 and stop signal 220-1 correlates to an edge of CLK 214 gated by D flip-flop 304-1. Therefore, the measurement window for TDC circuit 302-1 starts at the rising edge of REF 212 and ends at the rising edge of CLK 214. TDC circuit 302-2 is similarly driven by a start signal 218-2 and a stop signal 220-2. Start signal 218-2 is equivalent to stop signal 220-1, such that the measurement window for TDC circuit 302-2 begins at the end of the measurement window for TDC circuit 302-1 and correlates to the rising edge of CLK 214. Stop signal 220-2 correlates to a falling edge of CLK 214 and is gated by D flip-flop 304-2, which is controlled by the output of D flip-flop 304-1 and CLK 214 inverted by inverter 310. Therefore, the second window starts at the rising edge of CLK 214 and ends at the falling edge of CLK 214.

Figure 4:
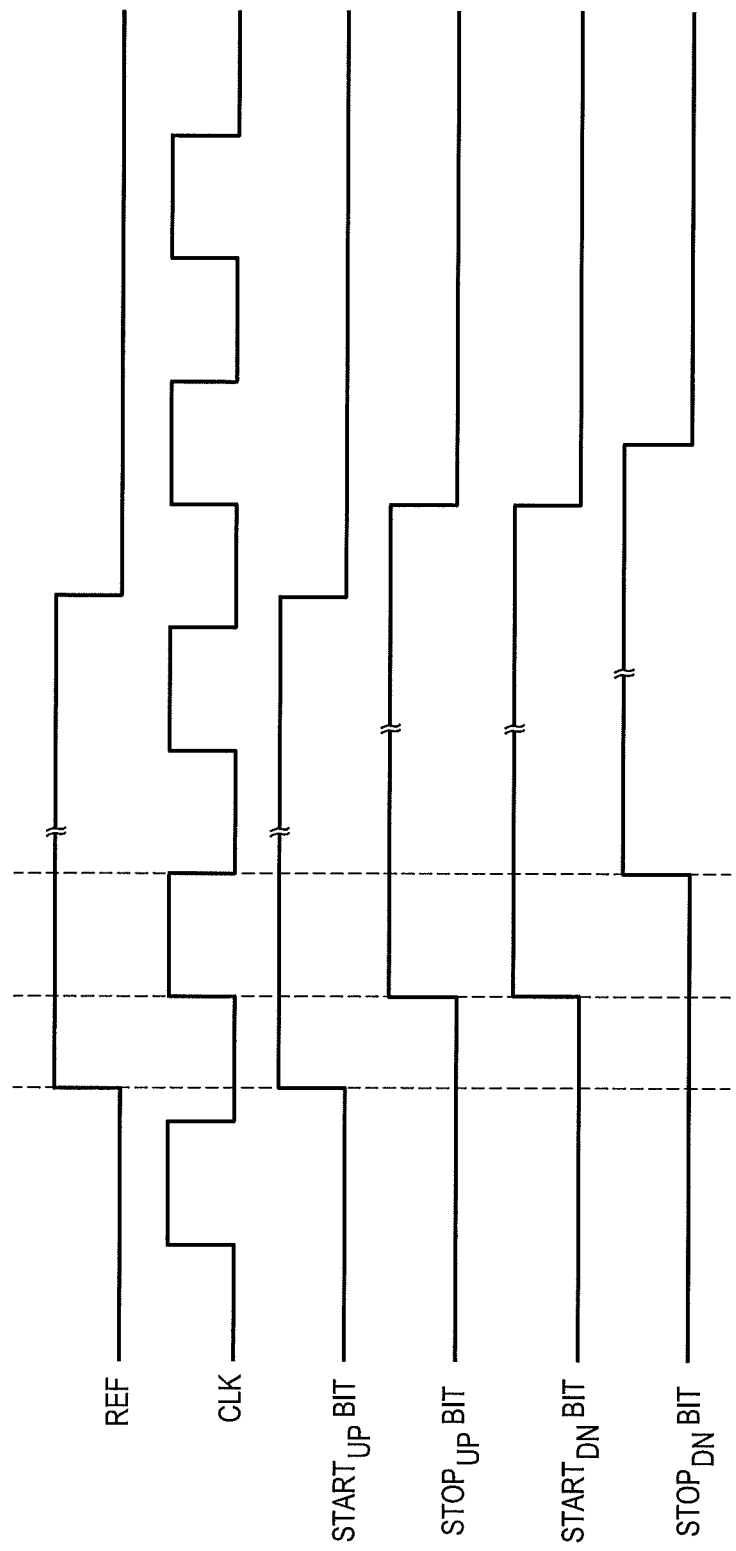
FIG. 4 is a timing diagram of signals related to one embodiment of a window-enabled TDC.

FIG. 4 is a timing diagram of various signals related to the window-enabled TDC embodiment of FIG. 3. REF 212 and CLK 214 of FIG. 3 are shown at the top of FIG. 4. REF 212 and CLK 214 are asynchronous and the output of the TDC will ultimately determine their phase difference. Beneath those signals are two pairs of start and stop bits. The first pair includes a $START_{UP}$ bit and a $STOP_{UP}$ bit. The rising edge of the $START_{UP}$ bit correlates to the rising edge of the REF signal. The $STOP_{UP}$ bit rising edge correlates to the rising edge of the CLK signal. These two bits define the measurement window for the first of two TDCs, TDC circuit 302-1. A second window is defined by the second pair of start and stop bits: a $START_{DN}$ bit and a $STOP_{DN}$ bit. The $START_{DN}$ bit rising edge correlates to the rising edge of the CLK signal and the $STOP_{UP}$ bit. The $STOP_{DN}$ bit correlates to the falling edge of the CLK signal. Together, the $START_{DN}$ bit and $STOP_{DN}$ bit drive the second TDC circuit, TDC circuit 302-2.

Figure 5:
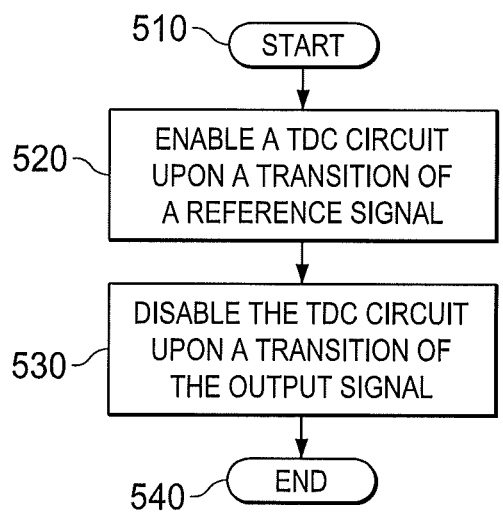
FIG. 5 is a flow diagram of one embodiment of a method of detecting phase of a reference signal.

FIG. 5 is a flow diagram of one embodiment of a method of detecting phase of a reference signal. The method begins at a start step 510. At a step 520 a TDC circuit is enabled upon a transition of a reference signal. In certain embodiments, the transition, or edge, of the reference signal is translated into a digital command to enable the TDC circuit, which is to start the measurement window. A "start bit" is produced and a reference pulse is injected into the TDC circuit.

In alternate embodiments, carried out within a PLL, the enabling of the TDC circuit of step 520 is preceded by a frequency acquisition of the reference signal that further enables the phase detection. Frequency acquisition yields a frequency error, similar to the phase error referred to above. These error components are combined, processed and ultimately employed by the PLL to control an oscillator that generates an output signal.

In the embodiment of FIG. 5, once the TDC circuit is enabled, the TDC circuit senses the reference signal edge and generates an output word that is related to a phase difference between the reference signal and an output signal. The output word is the result of a time quantization of the reference signal relative to the output signal. The output word is sometimes referred to as phase error.

The TDC circuit is disabled at a step 530 upon a transition, or edge, of the output signal. The edge of the output signal stops the measurement window and is the moment at which the output word is composed. Certain embodiments produce a "stop bit" that is used to indicate the second edge of the reference pulse. The first edge of the reference pulse correlates to the edge of the reference signal. The edge of the output signal, which is often a clock signal, is the later of the two pieces of data necessary to quantize the reference signal. A phase difference is ascertainable with just a single reference signal edge and the immediately following output signal edge. The window is defined by these edges outside of which the TDC circuit is inactive, which conserves power. The method ends at an end step 540.

Those skilled in the art to which this application relates will appreciate that other and further additions, deletions, substitutions and modifications may be made to the described embodiments.

What is claimed is:

1. A window-enabled time-to-digital converter (TDC), comprising:
    a window generator configured to receive a reference signal and a clock signal; and
    a TDC circuit coupled to said window generator and configured to be enabled based on said reference signal and disabled based on said clock signal.

2. The window-enabled TDC recited in claim 1 wherein said window generator is operable to enable said TDC circuit upon a rising edge of said reference signal.

3. The window-enabled TDC recited in claim 1 wherein said window generator is operable to disable said TDC circuit upon a rising edge of said clock signal.

4. The window-enabled TDC recited in claim 1 wherein said window generator is operable to transform said reference signal and said clock signal into window start and stop signals.

5. The window-enabled TDC recited in claim 4 wherein said TDC circuit further comprises a Vernier delay chain.

6. The window-enabled TDC recited in claim 1 wherein said TDC circuit is operable to generate an output related to a phase difference between said reference signal and said clock signal.

7. The window-enabled TDC recited in claim 1 further comprising a second TDC circuit coupled to said window generator and configured to be enabled and disabled based on said clock signal.

8. A method of detecting phase relative to an output signal, comprising:
    enabling a time-to-digital converter (TDC) circuit upon a transition of a reference signal; and
    disabling said TDC circuit upon a transition of said output signal thereby generating an output related to a phase difference between said reference signal and said output signal.

9. The method recited in claim 8 wherein said enabling and disabling are carried out within a phase-locked loop circuit.

10. The method recited in claim 9 further comprising achieving a frequency lock on said reference signal.

11. The method recited in claim 8 wherein said transition of a reference signal is a rising edge.

12. The method recited in claim 8 wherein said transition of said output signal is a rising edge.

13. The method recited in claim 8 wherein said disabling comprises:
generating a stop pulse; and
determining said phase difference based on said reference signal and said stop pulse.

14. The method recited in claim 8 wherein said enabling comprises generating a discrete window start signal and said disabling comprises generating a discrete window stop signal.

15. A phase-locked loop (PLL), comprising:
an oscillator configured to generate a clock signal based on an oscillator control signal having a phase error component;
a window generator configured to generate discrete signal edges based on said clock signal and a reference signal; and
a time-to-digital converter (TDC) circuit operable to at least partially determine said phase error component based on said discrete signal edges.

16. The PLL recited in claim 15 wherein said oscillator is a digitally controlled oscillator (DCO).

17. The PLL recited in claim 15 further comprising a frequency acquisition circuit configured to determine a frequency error component of said oscillator control signal and to lock onto a frequency associated with said reference signal before engaging said TDC circuit.

18. The PLL recited in claim 15 wherein said discrete signal edges are a TDC window start edge and a TDC window stop edge.

19. The PLL recited in claim 18 wherein said TDC window start edge is based on said reference signal and said TDC window stop edge is based on said clock signal.

20. The PLL recited in claim 15 wherein said window generator is configured to isolate said TDC circuit electrically from said reference signal.

* * * * *